(12) United States Patent
Cettour-Rose et al.

(10) Patent No.: US 6,442,023 B2
(45) Date of Patent: Aug. 27, 2002

(54) ELECTRONIC POWER DEVICE

(75) Inventors: Jacques Cettour-Rose, Ordizan; Daniel Fellmann, Ibos; Alain Pettibon, Pau, all of (FR)

(73) Assignee: Alstom, Paris (FR)

( * ) Notice: Subject to any disclaimer, the term of this patent is extended or adjusted under 35 U.S.C. 154(b) by 0 days.

(21) Appl. No.: 09/852,655

(22) Filed: May 11, 2001

(30) Foreign Application Priority Data

May 22, 2000 (FR) .............................................. 00 06512

(51) Int. Cl.⁷ ................................................. H05K 7/20
(52) U.S. Cl. ........................ 361/690; 361/698; 361/699; 174/15.1; 165/80.4; 165/104.33
(58) Field of Search ................................. 361/688, 689, 361/699, 701–704, 707, 709–711, 714–716; 165/80.4; 257/714; 174/15.1

(56) References Cited

U.S. PATENT DOCUMENTS

| | | | | |
|---|---|---|---|---|
| 3,918,084 A | * | 11/1975 | Schierz ........................ | 257/714 |
| 4,037,270 A | * | 7/1977 | Ahmann et al. ............. | 361/689 |
| 4,622,621 A | * | 11/1986 | Barre ........................... | 361/689 |
| 5,426,565 A | * | 6/1995 | Anderson .................... | 361/711 |
| 5,453,911 A | * | 9/1995 | Wolgemuth et al. ........ | 361/689 |
| 5,504,378 A | * | 4/1996 | Lindberg et al. ............ | 307/10.1 |
| 5,574,312 A | | 11/1996 | Bayerer et al. .............. | 257/706 |
| 5,636,684 A | * | 6/1997 | Teytu et al. ................. | 165/80.4 |
| 5,666,269 A | * | 9/1997 | Romero et al. .............. | 361/699 |
| 5,740,015 A | * | 4/1998 | Donegan et al. ............ | 361/699 |
| 5,998,240 A | * | 12/1999 | Hamilton et al. ........... | 438/122 |
| 6,302,190 B1 | * | 10/2001 | Clamp et al. ............... | 165/80.4 |

FOREIGN PATENT DOCUMENTS

| | | | | |
|---|---|---|---|---|
| EP | 0 844 812 | 5/1998 | ............ | H05K/7/20 |
| FR | 2 775 416 | 8/1999 | ............ | H05K/7/20 |

OTHER PUBLICATIONS

Patent Abstract of Japan vol. 0093, NO. 28 (E–369), Dec. 24, 1985 and JP 60–160151 A Aug. 21, 1985.
European search report dated Feb.20,2001.

* cited by examiner

Primary Examiner—Boris Chervinsky
(74) Attorney, Agent, or Firm—Sughrue Mion, PLLC

(57) ABSTRACT

An electronic power device comprising support plates each having one face receiving one or more power components and an opposite face in contact with a cooling fluid for cooling said power components by conduction, wherein at least one support plate is associated with another support plate disposed facing it and provided with similar power components, and wherein the power components of the two facing support plates are disposed facing one another and in the immediate vicinity of one another.

10 Claims, 4 Drawing Sheets

ELECTRONIC POWER DEVICE

The invention relates to an electronic power device, and more particularly to a device comprising power chips fixed on support plates, the plates being cooled by a cooling fluid. The electronic power device of invention is particularly applicable to electronic devices used in converter type circuits for distributing power in railway applications, in which the delivered current and voltage values are particularly large.

BACKGROUND OF THE INVENTION

In conventional manner, it is known to cool an electronic power component by coupling it to a heat exchanger and by inserting a ceramic plate between these two components to isolate the heat exchanger electrically from the component. Thus, document FR 2 775 416 discloses an electronic power device having power chips fixed on one face of a support plate, the other face of the plate having a heat exchanger. It is also known from that document to associate support plates in pairs by placing them on opposite sides of a cooling circuit, the heat exchangers then been disposed facing each other.

Nevertheless, such an electronic power device suffers from the drawback of generating parasitic switch loops of high inductance and thus of generating high voltage surges on switching, thus requiring the power components to be over-dimensioned so as to enable them to withstand such surges. Naturally, such over-dimensioning of power components presents the drawback of increasing manufacturing cost and of causing the power components to be larger in size.

OBJECT AND SUMMARY OF THE INVENTION

The object of the present invention is to propose an electronic power circuit enabling the above-mentioned drawbacks of a prior art to be mitigated.

To this end, the invention provides an electronic power device comprising support plates each having one face receiving one or more power components and an opposite face in contact with a cooling fluid for cooling said power components by conduction, wherein at least one support plate is associated with another support plate disposed facing it and provided with similar power components, and wherein the power components of the two facing support plates are disposed facing one another and in the immediate vicinity of one another.

In particular embodiments, the electronic power device can comprise one or more of the following characteristics taken in isolation or in any technically feasible combination:

each support plate is associated with another support plate disposed facing it and provided with similar power components, the power components of the facing support plates being disposed facing one another and in the immediate vicinity of one another;

said support plates are distributed over two frames made of electrically insulating material, each of the frames having openings whose outlines form seats for receiving said support plates, said two frames being of a form enabling the two frames to be associated one against the other with the support plates of the two facing frames, the free faces of the two adjacent frames supporting respective cooling boxes each having a cooling fluid circulation volume and means for supplying and for removing said fluid;

said two frames are identical;

each support plate is fed with electricity via at least one emitter and at least one collector projecting respectively from two opposite edges of said support plate so that the emitter feeding one support plate is disposed on the same side as and close to the collector feeding the facing support plate;

said frames support said emitters, said collectors, and a control circuit for controlling the power components;

each of said support plates receives two IGBT components presenting a common emitter disposed between the two IGBT components and projecting laterally from one side of the frame, each of said IGBT components having an independent collector projecting laterally from the other side of the frame;

a strip of heat conducting material such as copper or aluminum is brazed or soldered to those faces of the support plates which come into contact with the cooling fluid, said strip having folds constituting microchannels encouraging heat exchange with said fluid;

said frames and boxes are molded out of a plastics material and are assembled to one another by adhesive or by means of a sealing gasket; and said support plates are made by assembling an electrically insulating material that conducts heat such as aluminum nitride with a composite material that conducts heat and has a coefficient of expansion matching that of the electrically insulating material such as a composite of aluminum and silicon carbide, said electrically insulating material supporting the power components and said composite being in contact with the cooling fluid.

BRIEF DESCRIPTION OF THE DRAWINGS

The objects, aspects, and advantages of the present invention will be understood better on reading the following description of an embodiment of the invention given by way of non-limiting example and with reference to the accompanying drawings, in which.

MORE DETAILED DESCRIPTION

To make the drawings easier to read, only those elements which are necessary for understanding invention have been shown.

Figure 1:
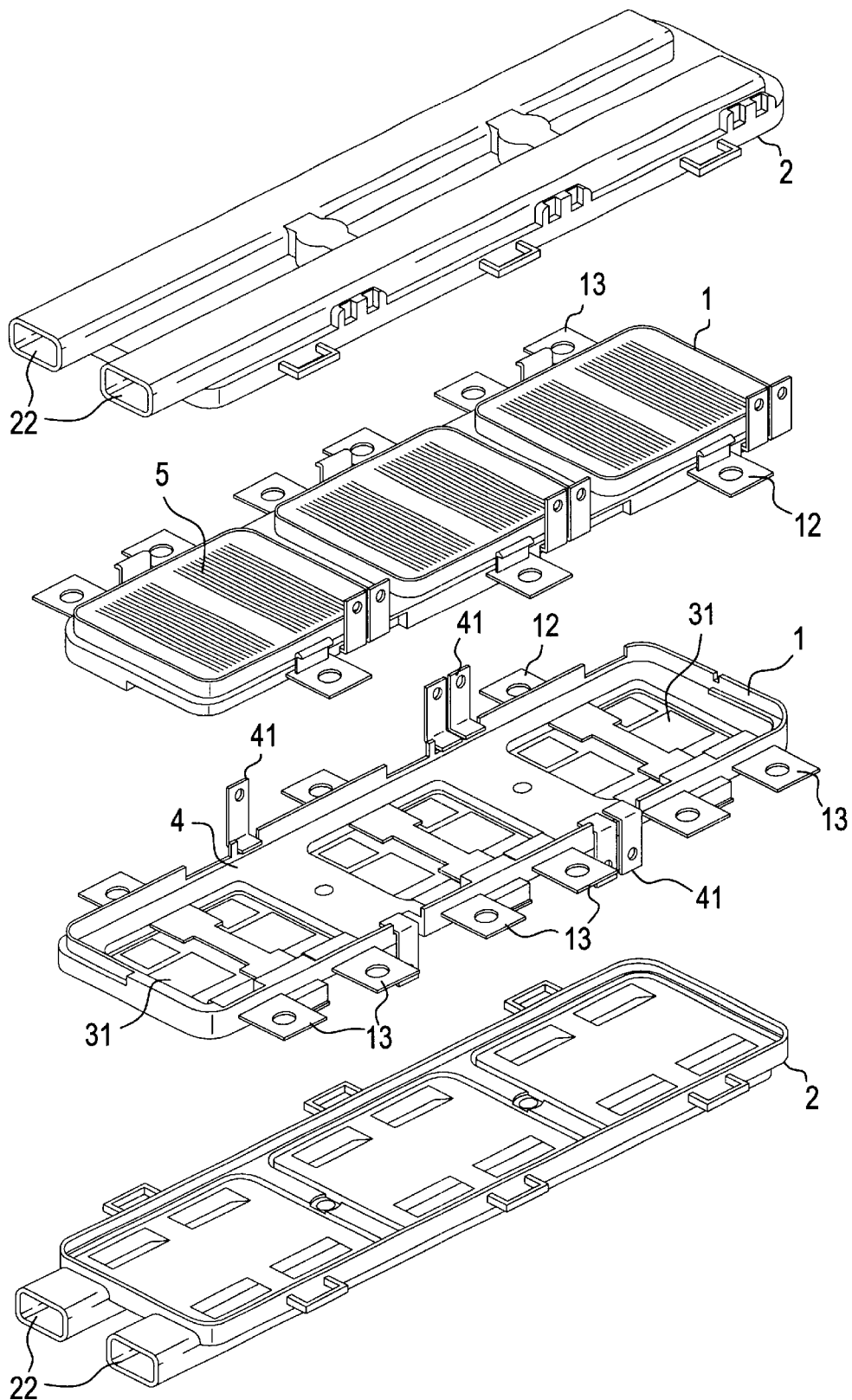
FIG. 1 is an exploded perspective view of an embodiment of the electronic power device of invention.

FIG. 1 it shows an electronic power device for a converter comprising two frames 1 of generally rectangular shape capable of being placed one against the other via one of their faces and capable of receiving respective cooling boxes 2 via their other faces. The frames 1 are substantially identical and they are made of an electrically insulating moldable material, e.g. an injection moldable resin of the polyphenylene dioxide type (PPO).

Figure 2:
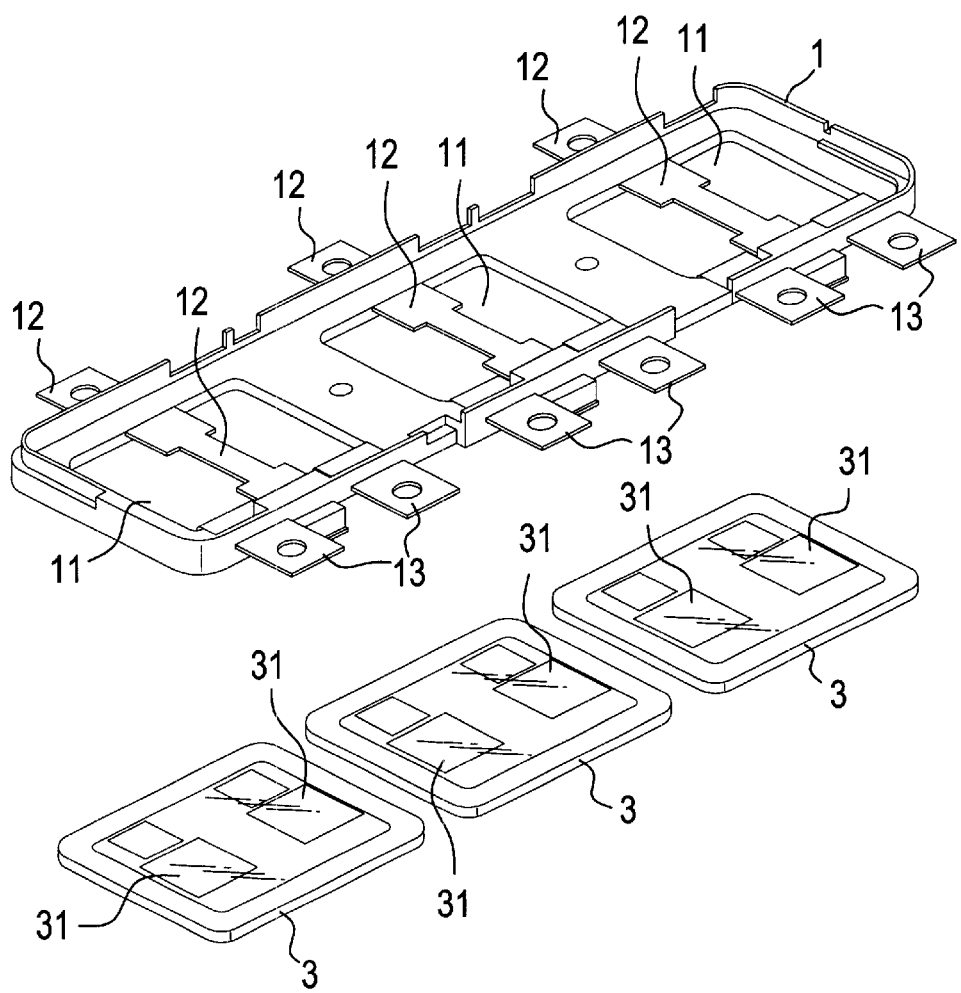
FIG. 2 is a perspective view showing how support plates are assembled on one of the frames of the FIG. 1 device.

As shown in FIG. 2, each frame one has three openings 11 each receiving a support plate 3 of metallized aluminum nitride having two power components 31 brazed thereto, e.g. of the insulated gate bipolar transistor type (IGBT). The support plates 3 also have respective strips of copper 5 brazed to their faces opposite their faces receiving the IGBT components 31, these copper strips 5 having folds constituting micro-channels that can be seen in FIGS. 1 and 3.

The support plates 3 are held pressed against the inside peripheries of the openings 11 by adhesive, optionally with gaskets (not shown) being interposed therebetween, in order to ensure a perfectly leak-proof connection. In a variant embodiment that is not shown, sealing between the support plates 3 and the frame 1 can equally well be provided by more intimate co-operation between the support plate 3 and the surround of the opening 11 that receives it, for example by overmolding the frame 1 on the support plates 3.

The power current feed of the IGBT components 31 in each support plate 3 takes place by means of emitters 12 and collectors 13 integrated in the frame 1 and extending respectively from two opposite sides of the frame 1. In each opening 11, the emitters 12 are constituted by respective conductive members passing centrally through the opening 11 and serving as an emitter common to both IGBT components 31 carried by the support plate 3. At one end, each emitter 12 has a connection tongue extending laterally from one side of the frame 1 and enabling it to be connected to an external connector (not shown). In each opening 11, the collectors 13 comprise two conductive members placed on the edge of the opening 11 remote from its edge receiving the connection tongue of the emitter 12. The collectors 13 are disposed on either side of the end of the emitter 12, and they project outside the frame 1 via connection tongues.

Control current is fed to the IGBT components 31 by means of a printed circuit 4 carried by the frame 1 and connecting to the grids of the IGBT components. The printed circuit 4, shown in FIG. 1, has connectors 41 disposed perpendicularly to the plane of the frame 1 and enabling connection to be made with wires (not shown) for controlling the IGBT components.

Figure 3:
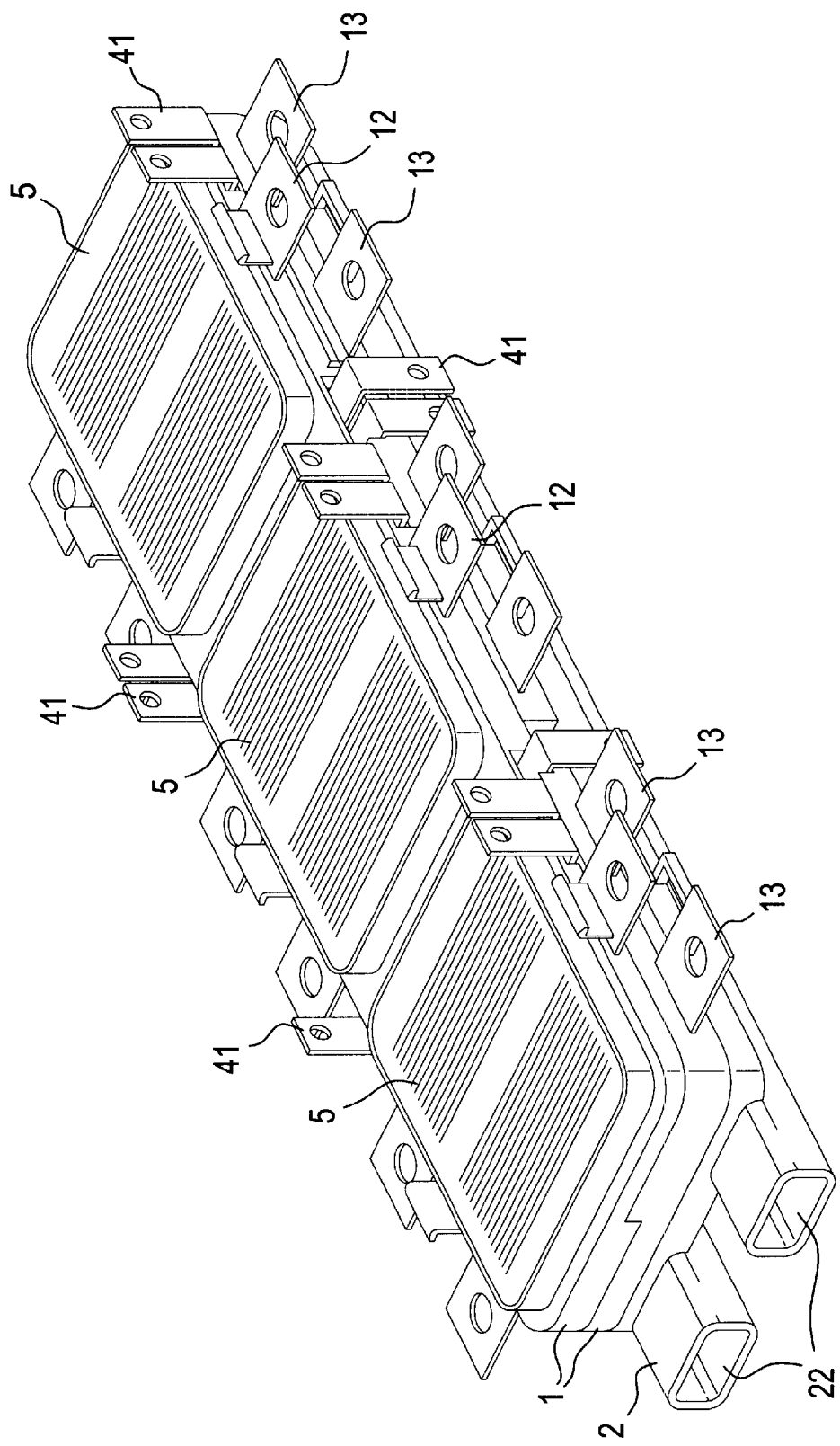
FIG. 3 is a perspective view on a larger scale showing the FIG. 1 device when both frames and the bottom housing have been assembled together.

The two frames 1 present complementary shapes enabling them to be assembled one against the other in such a manner that the support plates 3 of the frames 1 face each other and the IGBT components 31 carried by each support plate 3 of the frame 1 are disposed facing and in the immediate vicinity of the identical IGBT components 31 carried by a support plate 3 of the other frame 1. As shown in FIG. 3, once the two frames 1 have been put together, they form a compact assembly from which only the micro-channels of the copper strips 4 brazed to the support plates 3 extend from each opening 11.

The micro-channels of the support plates 3 are fed with cooling fluid by the two boxes 2 which are fitted to the frames 1, which boxes 2 have respective plane side faces provided with edges that match the outline of the frame 1, a sealing gasket that is not shown being interposed between each box 2 and the frame 1.

Figure 4:
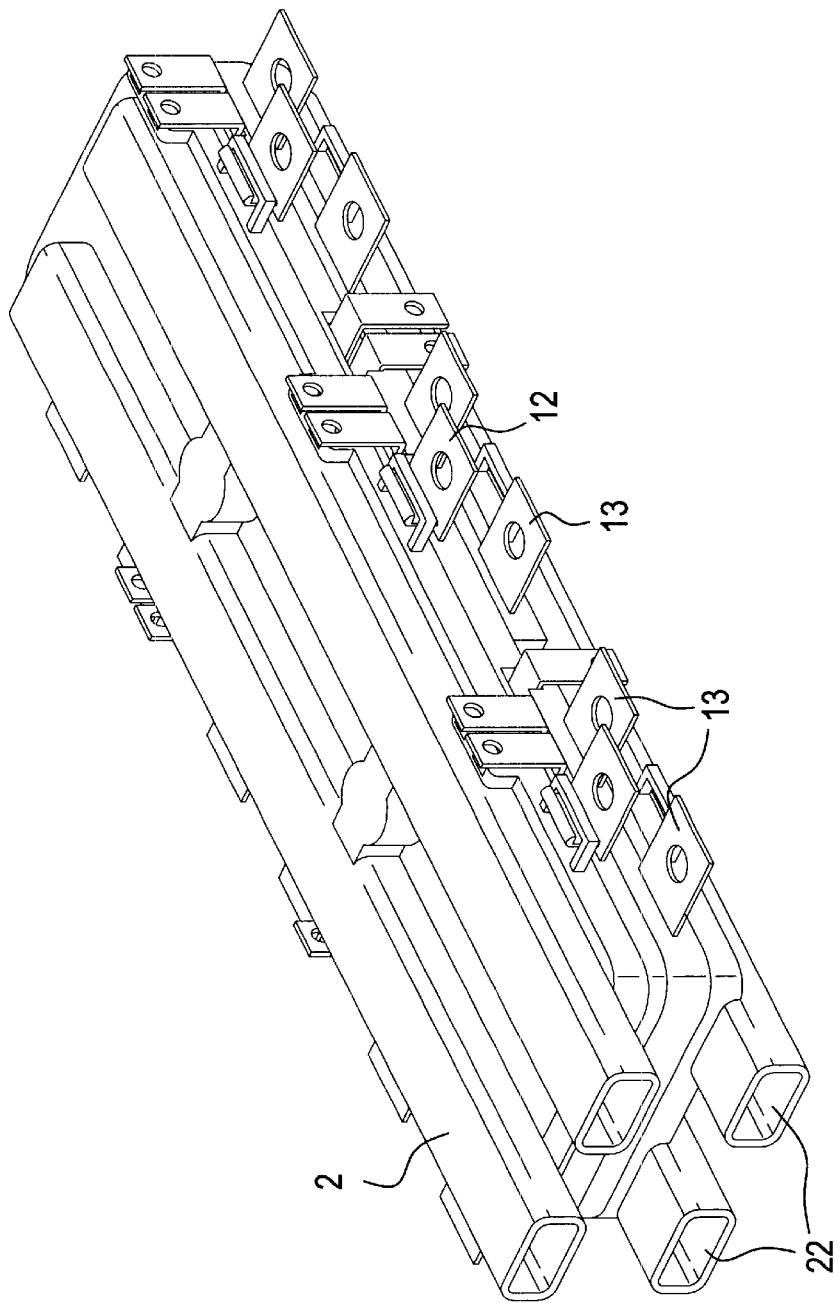
FIG. 4 is a view similar to FIG. 3 when all of the elements have been assembled together.

As shown in FIGS. 1 and 4, both boxes 2 are generally elongate in shape and include two channels extending longitudinally relative to the frame 1, having one end fitted with openings 22 enabling cooling fluid to be supplied and removed. Advantageously, the boxes 2 are made by molding a polymer material, of e.g. of the polyetherimide type (PEI).

Such an electronic power device presents the advantage of having very low parasitic inductance because the power components carried by each support plate are close to the identical power components carried by a facing support plate, which makes it possible to reduce switching surges considerably. For given operating power, such a device thus makes it possible to use components that withstand smaller surges and that are therefore less expensive, and it also makes it possible to take full advantage of possibilities for improving cooling.

A device to the invention also has the advantage of placing the emitters of the power components carried by one support plate close to the collectors of the power components carried by the other support plate facing it, thus making it possible substantially to cancel out the parasitic inductance generated thereby.

Furthermore, the use of a heat exchanger having a copper strip with folds to form micro-channels and which is brazed to a ceramic plate of standard type makes it possible to ensure that the power components are provided with excellent cooling at very low manufacturing cost.

The naturally, the invention is not limited in any way to the embodiment described and shown which has been given purely by way of example.

Thus, in a variant electronic device of invention,. the copper strip having folds could be made in some other material that conducts heat, such as aluminum.

In a variant embodiment, the support plates could be made of a composite material constituted by a layer of metal in contact with the cooling fluid together with a fine insulating layer supporting the power components.

What is claimed is:

1. An electronic power device comprising:
    a plurality of support plates, each support plate having (1) a first face receiving at least one power component, and (2) a second face in contact with a cooling fluid for cooling said at least one power component by conduction, said first and said second faces facing in opposite directions,
    wherein respective first faces of at least two support plates face one another, such that respective power components of said at least two facing support plates are disposed facing one another.

2. An electronic power device according to claim 1, wherein all of said support plates are arranged such that each first face faces another first face.

3. An electronic power device according to claim 1, further comprising:
    two frames made of electrically insulating material, each of said frames having openings respectively receiving said support plates, which are distributed over said two frames, said two frames being positioned one against the other; and
    two cooling boxes respectively provided on free faces of said two frames, each of said cooling boxes having a cooling fluid circulation volume.

4. An electronic power device according to claim 3, wherein said two frames are identical.

5. An electronic power device according to claim 1, wherein each support plate is fed with electricity via at least one emitter and at least one collector projecting respectively from two opposite edges of said support plate so that said emitter feeding one support plate is disposed on the same side as said collector feeding a facing support plate.

6. An electronic power device according to claim 3, wherein each support plate is fed with electricity via at least one emitter and at least one collector projecting respectively from two opposite edges of said support plate so that said emitter feeding one support plate is disposed on the same side as said collector feeding a facing support plate, and wherein said frames support said emitters, said collectors, and a control circuit for controlling said power components.

7. An electronic power device according to claim 3, wherein each of said support plates receives two IGBT components presenting a common emitter disposed between said two IGBT components and projecting laterally from one side of one of said frames, each of said IGBT components having an independent collector projecting laterally from another side of said one of said frames.

8. An electronic power device according to claim 1, further comprising:

strips of heat conducting material one of brazed and soldered respectively to said second faces of said support plates, said strips having folds to encourage heat exchange with said fluid.

9. An electronic power device according to claim 3, wherein said frames and said boxes are molded out of a plastics material.

10. An electronic power device according to claim 1, wherein said support plates comprise an assembly of (1) an electrically insulating material that conducts heat, and (2) a composite material that conducts heat and has a coefficient of expansion matching that of said electrically insulating material, said electrically insulating material supporting said power components and said composite material being in contact with said cooling fluid.

* * * * *

UNITED STATES PATENT AND TRADEMARK OFFICE
CERTIFICATE OF CORRECTION

| | | |
|---|---|---|
| PATENT NO. | : 6,442,023 B2 | |
| DATED | : August 27, 2002 | |
| INVENTOR(S) | : Jacques Cettour-Rose, Daniel Fellmann and Alain Petitbon | |

It is certified that error appears in the above-identified patent and that said Letters Patent is hereby corrected as shown below:

<u>Title Page,</u>
Item [75], Inventors, please correct the third named inventor as follows:

Please delete "Alain Pettibon" and insert therefor -- Alain Petitbon --.

Signed and Sealed this

Thirty-first Day of December, 2002

JAMES E. ROGAN
*Director of the United States Patent and Trademark Office*